United States Patent [19]

O'Connor

[11] 3,804,689

[45] Apr. 16, 1974

[54] PROCESS FOR REMOVING COPPER FILMS FROM SUBSTRATES

[75] Inventor: James E. O'Connor, Centerville, Ohio

[73] Assignee: The National Cash Register Company, Dayton, Ohio

[22] Filed: Dec. 3, 1971

[21] Appl. No.: 204,768

[52] U.S. Cl. .................... 156/233, 134/41, 156/235, 156/236, 156/247, 161/213, 161/406

[51] Int. Cl. ......................... B37b 31/00, B32b 35/00

[58] Field of Search ........... 156/233, 240, 232, 239, 156/247, 249, 3, 18, 241, 236, 235; 134/41

[56] References Cited

UNITED STATES PATENTS

| | | | |
|---|---|---|---|
| 3,043,728 | 7/1962 | Stauffer | 156/233 X |
| 3,350,250 | 10/1967 | Sanz et al. | 156/233 X |
| 3,433,670 | 3/1969 | Hill | 134/41 X |
| 3,518,130 | 6/1970 | Cacka et al. | 156/233 X |
| 3,598,741 | 8/1971 | Kanno | 134/41 X |

*Primary Examiner*—George F. Lesmes
*Assistant Examiner*—Lorraine T. Kendell
*Attorney, Agent, or Firm*—E. Frank McKinney; Robert J. Shafer

[57] ABSTRACT

A medium substantially free of copper oxide having a thin, electrically conductive copper film thereon is disclosed. The copper film or circuit is developed on copper oxide surfaces. The copper film then is contacted with dilute hydrofluoric acid. After washing and drying, the copper film is contacted with the adhesive surface of a medium substantially free of copper oxide. The medium is removed from the copper oxide surface with the copper film adhered to the adhesive surface intact. This medium can be used in electronic displays, microrecording and microcircuitry.

3 Claims, No Drawings

PROCESS FOR REMOVING COPPER FILMS FROM SUBSTRATES

This invention relates to a medium substantially free of copper oxide having a thin, electrically conductive copper film thereon. In another aspect, this invention relates to a process for the removal of the thin copper film from the copper oxide containing substrate on which it is produced.

Thin, copper films and processes for their production are known in the art. U.S. Pat. No. 3,704,467 issued Nov. 28, 1972, discloses thin copper oxide films evaporated onto glass substrates. U.S. Pat. application Ser. No. 72,235, filed Sept. 14, 1970, now abandoned, discloses thin, copper oxide films fire glazed onto tile substrates. U.S. Pat. application Ser. No. 204,706, filed on even date herewith in the name of Brian G. Frock discloses compacted masses of copper oxide, wherein copper films can be developed on the surface of the masses.

The surfaces of the copper oxide exhibit a bistable switching phenomenon in that the copper oxide surfaces can be switched from a dark-colored electrically non-conductive state to a copper-colored electrically conductive state. This switching can be reversed and repeated indefinitely. Various methods of switching are described in the previously mentioned patent applications. If desired, selected areas of a surface can be switched rather than the entire surface.

An example of selected switching would be the development of electrically conductive copper circuitry or patterns on the copper oxide surface. Removal of such films or circuits often met with difficulty. Therefore, the films generally are used in place on the substrates on which they are formed.

It now has been found that the thin, electrically conductive films can be removed from the substrates on which they are formed. Not only are the conductive films removed and placed on a medium substantially free of copper oxide, but the films are removed intact.

Accordingly, an object of this invention is to provide a medium substantially free of copper oxide having a thin, electrically conductive copper film thereon.

Another object of this invention is to provide a process for the removal of thin, electrically conductive copper films from the copper oxide containing substrates on which they are formed.

Other objects, aspects and advantages of this invention will be apparent to one skilled in the art from the following disclosure and appended claims.

Of importance to this invention is the fact that the thin copper film is removed intact. After providing a copper oxide surface which has been at least selectively switched to a thin, electrically conductive copper film (circuit, pattern or the like), the film is contacted with dilute hydrofluoric acid solution for a period of time ranging from 5 to 50 seconds, preferably 10 to 30 seconds. The hydrofluoric acid solution generally contains 5 to 30 weight percent hydrofluoric acid, preferably 10 to 20 weight percent. The remaining portion of the hydrofluoric acid solution is an inert medium such as water. Generally, the film is contacted with the acid solution by immersing the entire sample in the acid solution.

The film then is washed and dried by conventional means. Generally, the washing and drying is accomplished by rinsing with water and air drying.

The thin copper film is contacted with the adhesive surface of a medium substantially free of copper oxide coated with a pressure-sensitive adhesive. The medium is removed from the copper oxide containing substrate with the thin, electrically conductive copper film adhered to the adhesive surface intact. Essentially, all of the copper film is removed from the surface of preparation and essentially no copper oxide is found on the adhesive surface of the medium.

The medium containing the pressure-sensitive adhesive can vary widely. The medium can be a thin material such as a film web, sheet, ribbon, fabric or the like. Often, polyethylene terephthalate (Mylar) is employed. Other examples of materials that can be employed as the medium include cellulosic materials, paper, cellophane, nylon, rubber, polyethylene, polypropylene, and the like. The adhesives can be epoxy-nitrile rubber elastomers, polyesters, ethylene-vinyl acetate copolymers, polyamide resins, phenoxy resins, and the like and mixtures thereof. These mediums (subtrates) and adhesives are further described in abandoned U.S. Pat. application Ser. No. 156,543, filed June 24, 1971, which is a continuation of U.S. Pat. application Ser. No. 857,949, filed Sept. 15, 1969, now abandoned.

A preferred medium coating with a pressure-sensitive adhesive is "Scotch Tape."

The bond existing between the thin copper film and the copper oxide surface upon which they are formed is weakened by the hydrofluoric acid solution. The bond is not weakened enough for the thin copper films to be washed away or flaked off. However, care should be exercised as the film could be rubbed away.

The thin copper films have a thickness ranging from 0.005 to 0.020 millimeters and can have line widths as narrow as 0.03 millimeters.

The thickness of the adhesive on the medium varies widely as the electrically conductive copper film is adhered to the surface of the adhesive.

The article of this invention can be used in electronic displays, microrecording, microcircuitry and related technologies. For example, the article of this invention easily can be used in place of conventional printed circuits.

The advantages of this invention are further illustrated by the following examples. The materials and proportions and other specific conditions are presented as being typical and should not be construed to limit the invention unduly.

EXAMPLE I

Example I of previously mentioned U.S. Pat. application Ser. No. 72,235 discloses the preparation of a lead-oxide-copper oxide glaze on a magnesia-alumina-silicate ceramic tile. With the use of a laser beam as a heat source, the glaze is switched to a copper-colored state with fine-line resolution.

This copper film then was contacted with dilute aqueous hydrofluoric acid by immersion of the entire sample in a 10 weight percent aqueous solution of hydrofluoric acid for 20 seconds. The sample was removed, washed with water and air dried. Scotch Brand Transparent Tape No. 600 of Minnesota Mining and Manufacturing Co. then was applied with the adhesive side in contact with the treated copper film. The tape was applied with normal hand pressure. The tape was removed with the copper film adhered to the adhesive surface intact. The tape was removed merely by peeling the tape from the copper oxide surface. Essentially all of the copper film was removed from the copper oxide surface and essentially no copper oxide was found on the adhesive surface of the medium. The thin copper film retained its conductivity on the tape and this conductivity extended along the entire surface of the copper film.

EXAMPLE II

Two additional copper films were transferred to tape according to the procedure described in Example I. The only difference between these transfers and the transfer of Example I was that the glazed sample was replaced with the copper oxide coated glass substrate of Example I and II of previously mentioned U.S. Pat. No. 3,704,467 and a compacted mass of copper oxide from Example I of previously mentioned U.S. Pat. application Ser. No. 204,706. Prior to the hydrofluoric acid treatment, the copper oxide surfaces were switched to the copper-colored state.

In both cases, the entire film was transferred intact. When subjected to conductivity testing, the copper film retained its high electroconductivity on the tape.

In all samples prepared by this process, electrical testing of this pattern revealed that it had retained its substantially high electrical conductivity without breaking of the circuit thus demonstrating the capability of this invention to provide circuits of extreme thinness with high electrical conductivity and no copper oxide containing substrate.

Although this invention has been described in considerable detail, it must be understood that such detail is for the purpose of illustration only and that many variations and modifications can be made by one skilled in the art without departing from the scope and spirit thereof.

What is claimed is:

1. A process for the removal of thin, electrically conductive copper films from the substrates on which they are formed, consisting essentially of the steps of:

a. providing a substrate with at least one copper oxide surface wherein the copper oxide surface has been at least selectively switched to a thin, electrically conductive copper film;

b. contacting said thin copper film with a 5 to 30 weight percent aqueous solution of hydrofluoric acid for a period of time ranging from 5 to 50 seconds to weaken the bond between the copper film and the substrate;

c. washing and drying the copper film;

d. contacting said copper film with the adhesive surface of a thin, flexible, pressure sensitive adhesive-coated tape substantially free of copper oxide whereupon said copper film becomes more strongly adhered to said tape than to said substrate; and e. peeling said tape with essentially all of said copper film adhered thereto from said copper oxide surface, wherein said tape and said copper film are free of copper oxide.

2. A process according to claim 1 wherein the contacting of step (b) is carried out with a 10 to 20 weight percent solution of hydrofluoric acid for a period of time ranging from 10 to 30 seconds.

3. A process according to claim 1 wherein the washing and drying of step (c) is carried out by aqueous washing and air drying.

* * * * *